United States Patent

[11] 3,600,647

[72] Inventor Peter V. Gray
Scotia, N.Y.
[21] Appl. No. 15,680
[22] Filed Mar. 2, 1970
[45] Patented Aug. 17, 1971
[73] Assignee General Electric Company

[54] FIELD-EFFECT TRANSISTOR WITH REDUCED DRAIN-TO-SUBSTRATE CAPACITANCE
6 Claims, 1 Drawing Fig.

[52] U.S. Cl. ........ 317/235, 29/576
[51] Int. Cl. ........ H01l 11/00
[50] Field of Search ........ 317/235, 235.21.1, 234

[56] References Cited

UNITED STATES PATENTS

| | | | |
|---|---|---|---|
| 3,056,888 | 10/1962 | Atalla | 317/235 X |
| 3,241,931 | 3/1966 | Triggs et al. | 29/195 |
| 3,378,738 | 4/1968 | McIver | 317/235 |
| 3,470,390 | 9/1969 | Lin | 307/237 |
| 3,519,897 | 7/1970 | Ferrell | 317/234 |
| 3,532,945 | 10/1970 | Weckler | 317/235 |

*Primary Examiner*—James D. Kallam
*Attorneys*—John F. Ahern, Paul A. Frank, Jerome C. Squillaro, Frank L. Neuhauser, Oscar B. Waddell and Joseph B. Forman

ABSTRACT: A field-effect transistor having reduced drain-to-substrate capacitance is described as comprising a semiconductor substrate having a region of substantially lower resistivity than the substrate in the vicinity of the drain electrode. The region of low resistivity is of comparable depth to the drain region and produces devices having low drain-to-substrate capacitance and a higher drain-to-source "punch-through" voltage breakdown.

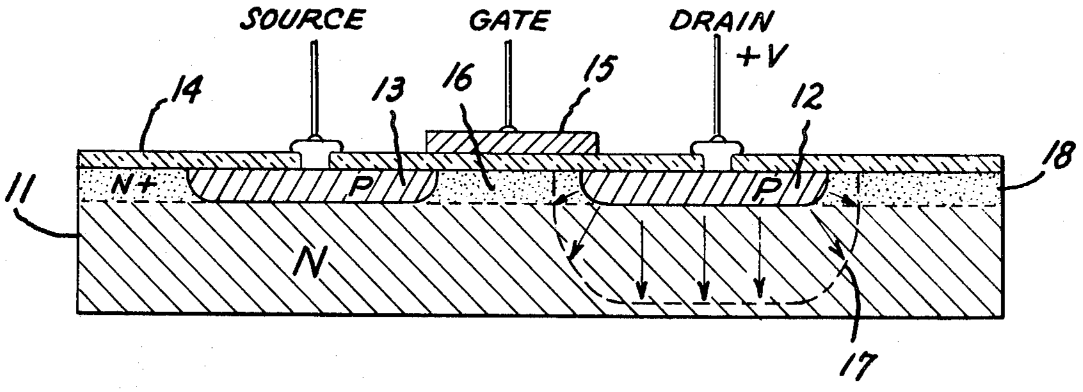
Inventor:
Peter V. Gray,
by Jerome C. Squillaro
His Attorney.

FIELD-EFFECT TRANSISTOR WITH REDUCED DRAIN-TO-SUBSTRATE CAPACITANCE

The present invention relates to semiconductor devices and more particularly to improved field-effect transistors having reduced drain-to-substrate capacitance.

The operation of field-effect transistors (FETs) depends upon the control of conductivity through a narrow or short channel under the influence of an electric field preferably established by an insulated gate electrode. Field-effect transistors of this type are generally fabricated by deposition and diffusion techniques. As in most semiconductor devices, the geometry of the device plays an important role in the electrical characteristics of the device. For example, the transconductance and hence the gain-bandwidth product of most FETs is inversely proportional to the length of the channel between the source and drain regions and also the capacitance of the drain region relative to the substrate.

By reducing the channel length, it is at least theoretically possible to improve the frequency response of the device. In doing so, however, the source and drain regions are brought closer together with the result that the drain depletion region extends across the channel region until it reaches the source and draws space-charge-limited current. This condition is referred to as drain-to-source "punch-through" breakdown. Accordingly, in attempting to fabricate field-effect transistors with short channel lengths, the drain-to-source breakdown voltage must be taken into account.

Still another parameter which limits the frequency response of field-effect transistors is the drain-to-substrate capacitance. This capacitance generally varies inversely with the voltage applied to the drain region and the resistivity of the substrate. As the drain voltage is increased, the peripheral capacitance of the drain junction decreases, however, as described above, with increased drain voltages, the drain depletion region extends across the channel region until it causes "punch-through" breakdown. Accordingly, the fabrication of field-effect transistors necessarily requires a compromise between channel length and "punch-through" breakdown.

It is therefore an object of the present invention to provide an improved field-effect transistor characterized by low drain-to-substrate capacitance.

It is another object of the present invention to provide a field-effect transistor having a high degree of immunity to drain-to-source voltage breakdown.

A further object of the present invention is to provide a field-effect transistor having a short-channel length with a high "punch-through" breakdown voltage.

Still another object of the present invention is to provide a field-effect transistor having a high gain-bandwidth product.

These and other objects and advantages of the instant invention are achieved in accord with one embodiment of the invention by providing a surface-adjacent region of low resistivity in the vicinity of the drain region so as to confine the lateral extent of the drain depletion region and hence prevent drain-to-source "punch-through." By selecting the depth or thickness of the low resistivity region to be approximately equal to that of the drain diffusion region, the high drain-to-substrate capacity normally associated with field-effect transistors fabricated in low resistivity substrates is obviated.

The novel features believed characteristic of the present invention are set forth in the appended claims. The invention, itself, together with further objects and advantages thereof, may best be understood by reference to the following detailed description taken in connection with the appended drawing, in which:

The FIGURE illustrates a cross-sectional view of an embodiment of the invention.

Before proceeding to a detailed description of the instant invention, a brief summary of some of the problems encountered in attempting to fabricate field-effect transistors having the aforementioned desirable characteristics may be helpful. Field-effect transistors, in general, include a pair of opposite-conductivity-type regions adjacent a major surface of a first-conductivity-type semiconductor material wherein the discrete regions, known as source and drain, are separated by a small-dimension channel region over which an overlapping insulated gate electrode is positioned. Conduction between the two regions occurs through the surface-adjacent portions of the channel between the source and drain. This surface channel is formed and modulated by a potential applied to the gate electrode. The length of the channel, i.e., the dimension parallel to the current flow between the source and drain regions, defines an exceedingly important parameter in the operation of a field-effect transistor. For example, for a given channel width, the transconductance is inversely proportional to the length of the channel. Therefore, a device having a given transconductance can be made physically smaller if the length of the channel can be reduced. This would not only decrease the gate capacity directly, but would also reduce lead capacity between associated devices in an integrated circuit.

A factor in determining the length of the channel region is the aforementioned drain-to-source "punch-through" breakdown. For field-effect transistors having a given size drain region, a larger depletion region is formed in a high resistivity substrate than in a low resistivity substrate. Accordingly, it would appear that a field-effect transistor should preferably be fabricated with a low resistivity substrate. However, the capacity between the drain region and substrate is much greater in a low resistivity substrate than in a high resistivity substrate. Accordingly, while short channel lengths are achievable in low resistivity substrates, the increase in drain-to-substrate capacitance offsets any advantages to be obtained by a reduced channel length. Therefore, the fabrication of present day field-effect transistors represents a compromise between channel length as determined by the drain-to-source "punch-through" breakdown and capacitance between the drain and substrate regions of the device.

The FIGURE illustrates an embodiment of the invention wherein the drain-to-substrate capacitance is substantially reduced while still retaining a short channel region between the source and drain regions. As illustrated in the FIGURE, the field-effect transistor of the instant invention comprises a semiconductor substrate 11 of, for example, N-type conductivity silicon with shallow source and drain diffusion regions 12 and 13, respectively, of P-type conductivity formed in the surface-adjacent portion of the substrate. Overlying the surface of the substrate is an insulating and passivating layer 14 such as an oxide of the semiconductor substrate.

Conduction between the source and drain regions is modulated by a gate electrode 15 overlying a surface-adjacent channel region 16. As illustrated in the FIGURE, upon application of a bias voltage between the source and drain regions, a depletion region 17 forms in the vicinity of the drain region 12. The larger the applied voltage, the larger will be the depletion region spreading both vertically and laterally. The minimum length of the channel region 16 is therefore limited by the extent of lateral spreading of the depletion region before drain-to-source "punch-through" breakdown occurs.

In accord with the teachings of the instant invention, the extent of lateral spreading of the depletion region and the drain-to-substrate capacity are substantially reduced by providing a surface-adjacent region 18 of reduced resistivity, at least in the vicinity of the drain-adjacent portion of the channel region 16. The low resistivity surface-adjacent region 18, illustrated in the FIGURE as $N^+$, is preferably coextensive with the surface of the substrate 11 and has a depth or thickness substantially equal to the depth or thickness of the drain diffusion region 12 so that the bottom portion of the drain diffusion region is adjacent the higher resistivity substrate 11 and only the edges of the drain region contact the lower resistivity surface-adjacent region 18. In this way, the drain-to-substrate capacity is minimized while at the same time providing a region of low resistivity around the edges of the drain region so as to substantially reduce the extent of lateral spreading of the depletion region 17.

Although the surface-adjacent region of lower resistivity 18 is illustrated in the FIGURE as being coextensive with substantially the entire surface of the substrate 11, it will be appreciated by those skilled in the art that the low resistivity region 18 need only be in the vicinity of the drain-adjacent portion of the channel region 16 to effect comparable results. This condition follows from the fact that it is the lateral spreading of the depletion region in the vicinity of the drain electrode which imposes a limitation on the shortness of the channel region 16; hence, it is only necessary to provide a region of lower resistivity in the vicinity of the drain-adjacent channel region to effect the desired result. However, from the standpoint of simplicity and cost of fabricating FETs in accord with the instant invention, a minimum number of additional fabrication steps is required if the region of low resistivity is made coextensive with substantially the entire surface of the substrate. Therefore, while it may be unnecessary to provide a region of low resistivity which is coextensive with substantially the entire surface of the substrate, it is generally easier to do so than to provide a region of low resistivity in only a selected portion of the substrate. This is particularly the case where the region of low resistivity is formed, for example, by impurity diffusion into the surface of a substrate or by epitaxial growth from the surface of the substrate. In each of these situations, selected low resistivity regions are generally formed by appropriately masking the substrate first.

In addition to diffusion and epitaxy processes, other techniques may be employed for producing the low resistivity region, if desired, however, the parameters of these processes are well known in the art and hence the thickness or depth of the low resistivity region can be accurately controlled by these processes.

In practicing the instant invention, it is preferable that the low resistivity region 18 be between 10 and 100 times lower in resistivity than that of the substrate. Since the reduction in drain-to-substrate capacity is proportional to the resistivity of the substrate region 11 relative to the surface-adjacent diffusion region 18, reduced drain-to-substrate capacitance is obtained for all ratios greater than 1; however, it is preferable that at least a ratio of 10:1 be employed to obtain substantially reduced capacitance between the drain and substrate regions.

As is also well known by those skilled in the art, the resistivity of a diffusion region varies with the distance from the diffusion surface. Accordingly, in practicing the instant invention, those skilled in the art can readily appreciate that numerous variations in diffusion times and temperatures will produce varying degrees of improvement in reducing the drain-to-substrate capacitance. Therefore, it should be understood that my invention resides in the discovery that by providing a drain region of an FET with a region of substantially lower resistivity than the substrate in the drain-adjacent channel region, the capacitance between the drain and substrate is substantially reduced and the drain depletion region formed by appropriately biasing the drain-to-substrate junction, produces a substantially vertical field distribution with only minimal lateral spreading into the channel region. Therefore, while different degrees of improvement in device performance can be obtained by varying the depth and resistivity of the surface-adjacent low resistivity region, such changes are considered to be within the scope of the instant invention.

From the foregoing description, it is readily apparent that there is disclosed a new and improved family of field-effect transistors having low drain-to-substrate capacitance and high drain-to-source "punch-through" breakdown voltages which permits the fabrication of FETs with high gain-bandwidth characteristics.

While the invention has been described with reference to a specific embodiment, it is quite apparent that numerous variations and modifications of the invention are possible. For example, the teachings of the instant invention are applicable not only to enhancement mode field-effect transistors but also depletion mode field-effect transistors whether fabricated as junction-type or insulated-gate type transistors. Accordingly, by the use of a low resistivity region in the vicinity of the drain region, it is possible to substantially reduce the drain-to-substrate capacitance and confine the drain depletion region to vertical spreading so as to enable the fabrication of high frequency field-effect transistors with high drain-to-source "-punch-through" voltages. Accordingly, I intend by the appended claims to cover all such modifications and changes as fall within the true spirit and scope of the present invention.

What I claim as new and desire to secure by Letters Patent of the United States is:

1. An improved field-effect transistor comprising:
 a semiconductor substrate of a first-conductivity type having source and drain regions of opposite-conductivity type formed in a major surface thereof;
 an insulated gate electrode overlying at least a portion of a channel region between said source and drain regions; and
 a surface-adjacent region of lower resistivity than said substrate in at least the drain-adjacent portion of said channel region.

2. The field-effect transistor of claim 1 wherein said region of lower resistivity is substantially coextensive with said major surface and is of a thickness approximating the thickness of said drain region.

3. The field-effect transistor of claim 1 wherein the ratio of resistivities of said substrate to said surface-adjacent region is between 10 and 100.

4. The field-effect transistor of claim 1 wherein said region of lower resistivity increases the drain-to-source breakdown voltage.

5. The field-effect transistor of claim 1 wherein said region of lower resistivity is of the same conductivity type as said substrate.

6. The field-effect transistor of claim 1 wherein said region of lower resistivity is substantially coextensive with the surface of said substrate and substantially surrounds said drain region.